(12) United States Patent
Sorensen

(10) Patent No.: US 8,116,703 B2
(45) Date of Patent: Feb. 14, 2012

(54) WIRELESS TRANSMITTER CALIBRATION USING DEVICE RECEIVER

(75) Inventor: Robert Sorensen, Fremont, CA (US)

(73) Assignee: Apple Inc., Cupertino, CA (US)

( * ) Notice: Subject to any disclaimer, the term of this patent is extended or adjusted under 35 U.S.C. 154(b) by 589 days.

(21) Appl. No.: 12/330,497

(22) Filed: Dec. 8, 2008

(65) Prior Publication Data
US 2010/0144286 A1    Jun. 10, 2010

(51) Int. Cl.
H03C 1/62    (2006.01)

(52) U.S. Cl. .................................................. 455/115.1

(58) Field of Classification Search ............... 455/115.1, 455/115.2, 115.3
See application file for complete search history.

(56) References Cited

U.S. PATENT DOCUMENTS

| | | | |
|---|---|---|---|
| 6,008,698 A | 12/1999 | Dacus et al. | |
| 6,163,706 A | 12/2000 | Rozenblit et al. | |
| 6,178,313 B1 | 1/2001 | Mages et al. | |
| 6,323,729 B1 | 11/2001 | Sevenhans et al. | |
| 6,735,422 B1 | 5/2004 | Baldwin et al. | |
| 6,819,910 B2 | 11/2004 | Shi et al. | |
| 6,819,938 B2 | 11/2004 | Sahota | |
| 7,110,469 B2 | 9/2006 | Shi et al. | |
| 7,342,955 B2 | 3/2008 | Forest et al. | |
| 7,398,106 B2 | 7/2008 | Conyers et al. | |
| 7,558,539 B2 * | 7/2009 | Huynh et al. | 455/126 |
| 7,962,109 B1 * | 6/2011 | Stockstad et al. | 455/115.1 |
| 7,970,427 B2 * | 6/2011 | Agahi et al. | 455/522 |
| 2004/0176145 A1 | 9/2004 | Lee et al. | |
| 2004/0192408 A1 | 9/2004 | Sharp et al. | |
| 2005/0136869 A1 | 6/2005 | Liu | |
| 2005/0186923 A1 | 8/2005 | Chen et al. | |
| 2006/0046668 A1 | 3/2006 | Uratani et al. | |
| 2006/0068830 A1 | 3/2006 | Klomsdorf et al. | |
| 2006/0252392 A1 | 11/2006 | Beamish et al. | |
| 2008/0002786 A1 | 1/2008 | Kerth et al. | |

FOREIGN PATENT DOCUMENTS

EP    1237297 A2    4/2002

(Continued)

OTHER PUBLICATIONS

Dimpflmaier et al, U.S. Appl. No. 12/465,260, filed May 13, 2009.

(Continued)

*Primary Examiner* — Jeffrey Zweizig
(74) *Attorney, Agent, or Firm* — Treyz Law Group; G. Victor Treyz; Chih-Yun Wu

(57) ABSTRACT

Portable electronic devices are provided that contain radio-frequency transceiver circuitry. Power amplifier circuitry may amplify transmitted radio-frequency signals from the radio-frequency transceiver circuitry. The power amplifier circuitry may be powered with a power supply voltage. The power supply voltage may be reduced to conserve power provided that requirements such as adjacent channel leakage ratio requirements are satisfied. Calibration measurements may be made to determine the extent to which power can be conserved by power supply voltage reductions. During calibration, the transceiver circuitry may transmit signals in a transmit subband. Test equipment that is external to the device may frequency shift the transmitted signals into a receive subband. The frequency-shifted signals may be fed back into the device. The transceiver circuitry in the device may make power measurements on the fed back signals. The power measurements may be used to compute adjacent channel leakage ratio values.

20 Claims, 9 Drawing Sheets

FOREIGN PATENT DOCUMENTS

| | | |
|---|---|---|
| EP | 1986331 A1 | 10/2008 |
| JP | 2003163607 A | 8/2005 |
| WO | 9849771 A1 | 4/1998 |
| WO | 0122604 A1 | 3/2001 |
| WO | 03075452 A2 | 9/2003 |
| WO | 2004077664 A1 | 9/2004 |
| WO | 2007149346 A2 | 12/2007 |

OTHER PUBLICATIONS

Sorensen, U.S. Appl. No. 12/262,121, filed Oct. 30, 2008.
Motorola, "Comparison of PAR and Cubic Metric for Power Derating", 3GPP Draft, R1-040642_EU9.5CUBICMETRIC, 3rd Generation Partnership Project (3GPP), Mobile Competence Centre, 650, Route Des Lucioles, F-06921 Sophia-Antipolis Cedex, France, vol. RAN WG4, no. Prague, Czech Republic, 20040812, Aug. 12, 2004, XP05017315.
"Understanding the Cubic Metric," [online]. Agilent Technologies, Inc. 2000-2009 [retrieved on Apr. 2, 2009] <URL: http://wireless.agilent.com/wireless/helpfiles/n7600b/cubic_metric.htm>.
Sorensen et al., U.S. Appl. No. 12/110,260, filed Apr. 25, 2008.
Takeya et al., U.S. Appl. No. 12/125,534, filed May 28, 2008.
"R&S CMU200 Universal Radio Communication Tester", Rohde & Schwarz, Nov. 2007.

\* cited by examiner

WIRELESS TRANSMITTER CALIBRATION USING DEVICE RECEIVER

BACKGROUND

This invention relates generally to wireless communications circuitry, and more particularly, to calibrating wireless communications circuitry to allow reduced power consumption.

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Due in part to their mobile nature, portable electronic devices are often provided with wireless communications capabilities. For example, handheld electronic devices may use long-range wireless communications to communicate with wireless base stations. Cellular telephones and other devices with cellular capabilities may communicate using cellular telephone bands at 850 MHz, 900 MHz, 1800 MHz, and 1900 MHz. Portable electronic devices may also use short-range wireless communications links. For example, portable electronic devices may communicate using the Wi-Fi® (IEEE 802.11) bands at 2.4 GHz and 5.0 GHz and the Bluetooth® band at 2.4 GHz. Communications are also possible in data service bands such as the 3G data communications band at 2170 MHz (commonly referred to as UMTS or Universal Mobile Telecommunications System band). The use of 3 G communications schemes for supporting voice communications is also possible.

To satisfy consumer demand for small form factor wireless devices, manufacturers are continually striving to reduce the size of components that are used in these devices. For example, manufacturers have made attempts to miniaturize the batteries used in handheld electronic devices.

An electronic device with a small battery has limited battery capacity. Unless care is taken to consume power wisely, an electronic device with a small battery may exhibit unacceptably short battery life. Techniques for reducing power consumption may be particularly important in wireless devices that support cellular telephone communications, because users of cellular telephone devices often demand long talk times.

It is important that power reduction techniques for electronic devices be implemented in a way that allows desired performance criteria be satisfied. As an example, many wireless carriers specify required values for adjacent channel leakage ratio (ACLR). High adjacent channel leakage ratio values are an indicator of poor radio-frequency transmitter performance and must generally be avoided to ensure satisfactory network operation. When minimizing power consumption, it would be advantageous to be able to take into account performance characteristics such as adjacent channel leakage ratio performance characteristics, so that improvements in power consumption performance do not inhibit satisfactory wireless performance.

It would therefore be desirable to be able to provide ways in which to calibrate electronic devices with wireless communications circuitry.

SUMMARY

An electronic device may have wireless circuitry. The wireless circuitry may be calibrated. The wireless circuitry may contain a power amplifier that is powered by a power supply voltage. During operation, calibration data that is stored in the electronic device may be used in determining how to control the power supply voltage, so as to reduce power consumption without exceeding desired operating limits. For example, the calibration data may be used in determining how to lower power amplifier power consumption without causing the wireless circuitry to exhibit undesirable levels of adjacent channel leakage ratio.

Each electronic device may be calibrated individually using its own circuitry. During calibration operations, a given device may be connected to test equipment using a radio-frequency connector that is interposed between wireless transceiver circuitry in the device and an antenna in the device. The test equipment may include a directional coupler, a radio-frequency signal mixer, and a radio-frequency signal generator.

The device may be directed to transmit radio-frequency signals for a particular channel. The transmitted signals may, for example, lie within a transmit subband of a particular cellular telephone communications band. The transmitted signals may be frequency shifted by the test equipment so that the frequency-shifted signals fall within a receive subband of the same cellular telephone communications band. The frequency-shifted signals may be fed back into the device using the radio-frequency connector.

The device may contain a duplexer. Transmitted signals may be routed to the test equipment through the power amplifier and the duplexer. Incoming signals that are being fed back into the device may be routed by the duplexer into the radio-frequency transceiver circuitry. The radio-frequency transceiver circuitry can make power measurements on the fed back signals, thereby obtaining a measure of the transmitted signal power for the transmitted channel. Frequency shifting adjustments may be made using the signal generator in the test equipment. These adjustments may direct power from adjacent channels onto the channel being monitored by the radio-frequency transceiver circuitry. This allows adjacent channel leakage ratio values to be computed.

The power supply voltage that is used for the power amplifier in the device may be lowered to the minimum possible that satisfies desired adjacent channel leakage ratio requirements. A frequency-dependent table containing values of minimum acceptable power supply voltage may be used as a form of calibration data for the electronic device. Calibration data may also include acceptable power amplifier input powers for each frequency.

Calibration data may be stored in nonvolatile memory in the device. During operation, the calibration data may be used to ensure that desired operating characteristics such as desired levels of adjacent channel leakage ratio are obtained while minimizing power consumption.

Further features of the invention, its nature and various advantages will be more apparent from the accompanying drawings and the following detailed description of the preferred embodiments.

DETAILED DESCRIPTION

The present invention relates generally to wireless communications, and more particularly, to managing power consumption by wireless communications circuitry in wireless electronic devices while satisfying desired performance criteria.

The wireless electronic devices may be portable electronic devices such as laptop computers or small portable computers of the type that are sometimes referred to as ultraportables. The wireless electronic devices may also be somewhat smaller devices. Examples of smaller wireless electronic devices include wrist-watch devices, pendant devices, headphone and earpiece devices, and other wearable and miniature devices. With one suitable arrangement, the wireless electronic devices may be portable electronic devices such as handheld electronic devices.

The wireless devices may media players with wireless communications capabilities, handheld computers (also sometimes called personal digital assistants), remote controllers, global positioning system (GPS) devices, handheld gaming devices, or cellular telephones. The wireless electronic devices may also be hybrid devices that combine the functionality of multiple conventional devices. An example of a hybrid device is a cellular telephone that includes media player functionality, communications functions, web browsing capabilities, and support for a variety of other business and entertainment applications such as the iPhone® cellular telephones available from Apple Inc. of Cupertino, Calif. These are merely illustrative examples.

Figure 1:
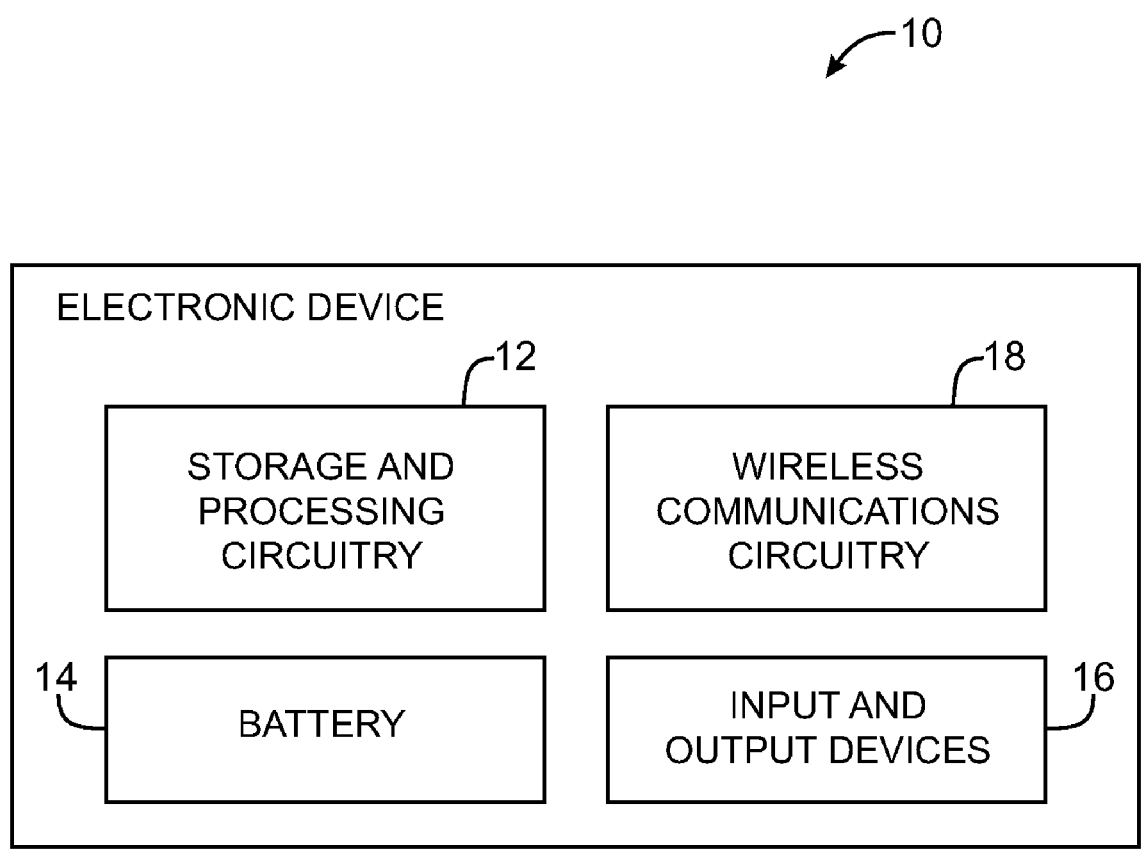
FIG. 1 is a diagram of an illustrative electronic device with wireless communications circuitry suitable for calibration in accordance with an embodiment of the present invention.

A schematic diagram of an embodiment of an illustrative wireless electronic device such as a handheld electronic device is shown in FIG. 1. Electronic device 10 of FIG. 1 may be a mobile telephone such as a cellular telephone with media player capabilities, a handheld computer, a remote control, a game player, a global positioning system (GPS) device, a laptop computer, a tablet computer, an ultraportable computer, a combination of such devices, or any other suitable electronic device.

As shown in FIG. 1, device 10 may include storage and processing circuitry 12. Storage and processing circuitry 12 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 12 may be used in controlling the operation of device 10. Processing circuitry in circuitry 12 may be based on processors such as microprocessors, microcontrollers, digital signal processors, dedicated processing circuits, power management circuits, audio and video chips, and other suitable integrated circuits.

With one suitable arrangement, storage and processing circuitry 12 may be used to run software on device 10, such as internet browsing applications, voice-over-internet-protocol (VOIP) telephone call applications, email applications, media playback applications, operating system functions, etc. Storage and processing circuitry 12 may be used in implementing suitable communications protocols. Communications protocols that may be implemented using storage and processing circuitry 12 include internet protocols, wireless local area network protocols (e.g., IEEE 802.11 protocols—sometimes referred to as Wi-Fi®), protocols for other short-range wireless communications links such as the Bluetooth® protocol, protocols for handling 2G and 3G cellular telephone communications services, etc.

Device 10 may have one or more batteries such as battery 14. To minimize power consumption and thereby extend the life of battery 14, storage and processing circuitry 12 may be used in implementing power management functions for device 10. For example, storage and processing circuitry 12 may be used to adjust the gain of radio-frequency power amplifier circuitry on device 10 and may be used in adjusting input power levels provided to the input of radio-frequency power amplifier circuitry on device 10 from a transceiver circuit. Storage and processing circuitry 12 may also be used to adjust the power supply voltages that are used in powering the radio-frequency power amplifier circuitry. These adjustments may be made automatically in real time based on calibration data and operating algorithms (software). For example, code may be stored in storage and processing circuitry 12 that configures storage and processing circuitry 36 to implement a control scheme in which operating settings are adjusted in accordance with calibration data to satisfy desired performance criteria such as desired transmit powers and adjacent channel leakage ratio values while minimizing power consumption.

Input-output devices 16 may be used to allow data to be supplied to device 10 and to allow data to be provided from device 10 to external devices. Examples of input-output devices 16 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through devices 16. Devices 16 may also be used to convey visual or sonic information to the user of device 10. Devices 16 may include connectors for forming data ports (e.g., for attaching external equipment such as computers, accessories, etc.).

Wireless communications devices 18 may include communications circuitry such as radio-frequency (RF) transceiver circuitry formed from one or more integrated circuits, power amplifier circuitry (e.g., power amplifier circuitry that is controlled by control signals from storage and processing circuitry 12 to minimize power consumption while satisfying desired performance criteria), passive RF components, antennas, and other circuitry for handling RF wireless signals. Wireless signals can also be sent using light (e.g., using infrared communications).

Device 10 can communicate with external devices such as accessories, computing equipment, and wireless networks over wired and wireless communications paths.

For example, accessories such as wired or wireless headsets may communicate with device 10. Device 10 may also be connected to audio-video equipment (e.g., wireless speakers, a game controller, or other equipment that receives and plays audio and video content), or a peripheral such as a wireless printer or camera.

Device 10 may use a wired or wireless path to communicate with a personal computer or other computing equipment. The computing equipment may be, for example, a computer that has an associated wireless access point (router) or an internal or external wireless card that establishes a wireless connection with device 10. The computer may be a server (e.g., an internet server), a local area network computer with or without internet access, a user's own personal computer, a peer device (e.g., another portable electronic device 10), or any other suitable computing equipment.

Device 10 can also communicate with wireless network equipment, such as cellular telephone base stations, cellular towers, wireless data networks, computers associated with wireless networks, etc. Such wireless networks may include network management equipment that monitors the wireless signal strength of the wireless handsets such as device 10 that are in communication with the network. To improve the overall performance of the network and to ensure that interference between handsets is minimized, the network management equipment may send power adjustment commands (sometimes referred to as transmit power control commands) to each handset. The transmit power control settings that are provided to the handsets direct handsets with weak signals to increase their transmit powers, so that their signals will be properly received by the network. At the same time, the transmit power control settings may instruct handsets whose signals are being received clearly at high power to reduce their transmit power control settings. This reduces interference between handsets and allows the network to maximize its use of available wireless bandwidth.

When devices such as device 10 receive transmit power control settings from the network or at other suitable times, each device 10 may make suitable transmission power adjustments. For example, a device may adjust the power level of signals transmitted from transceiver circuitry to radio-frequency power amplifiers on the device and may adjust the radio-frequency power amplifiers. Adjustments such as these may include gain mode settings adjustments and power supply voltage adjustments.

The output signals from the power amplifiers on devices 10 are wirelessly transmitted from device 10 to suitable receivers using antennas on devices 10. The settings for wireless communications circuitry 18 may include gain mode adjustments that control the gain settings of power amplifiers. For example, a gain mode adjustment may control whether a power amplifier is operating in a high gain mode in which all power amplifier stages that are available are being used or a low gain mode in which one or more of the gain stages on the power amplifier have been shut down to conserve power. Power supply voltage adjustments may be used to help minimize power consumption at a given gain setting. In typical circuit architectures, a transceiver circuit may supply radio-frequency signals to the input of a power amplifier for transmission through an antenna. The power at which the transceiver circuit outputs these radio-frequency signals establishes an input power level (sometimes referred to herein as Pin) for the power amplifier. Input power adjustments (adjustments to Pin) can be made to adjust the power of radio-frequency signals transmitted by device 10.

The antenna structures and wireless communications devices of device 10 may support communications over any suitable wireless communications bands. For example, wireless communications devices 18 may be used to cover communications frequency bands such as cellular telephone voice and data bands at 850 MHz, 900 MHz, 1800 MHz, 1900 MHz, and the communications band data at 2170 MHz band (commonly referred to as a UMTS or Universal Mobile Telecommunications System band), the Wi-Fi® (IEEE 802.11) bands at 2.4 GHz and 5.0 GHz (also sometimes referred to as wireless local area network or WLAN bands), the Bluetooth® band at 2.4 GHz, and the global positioning system (GPS) band at 1550 MHz.

Device 10 can cover these communications bands and other suitable communications bands with proper configuration of the antenna structures in wireless communications circuitry 18. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands.

Figure 2:
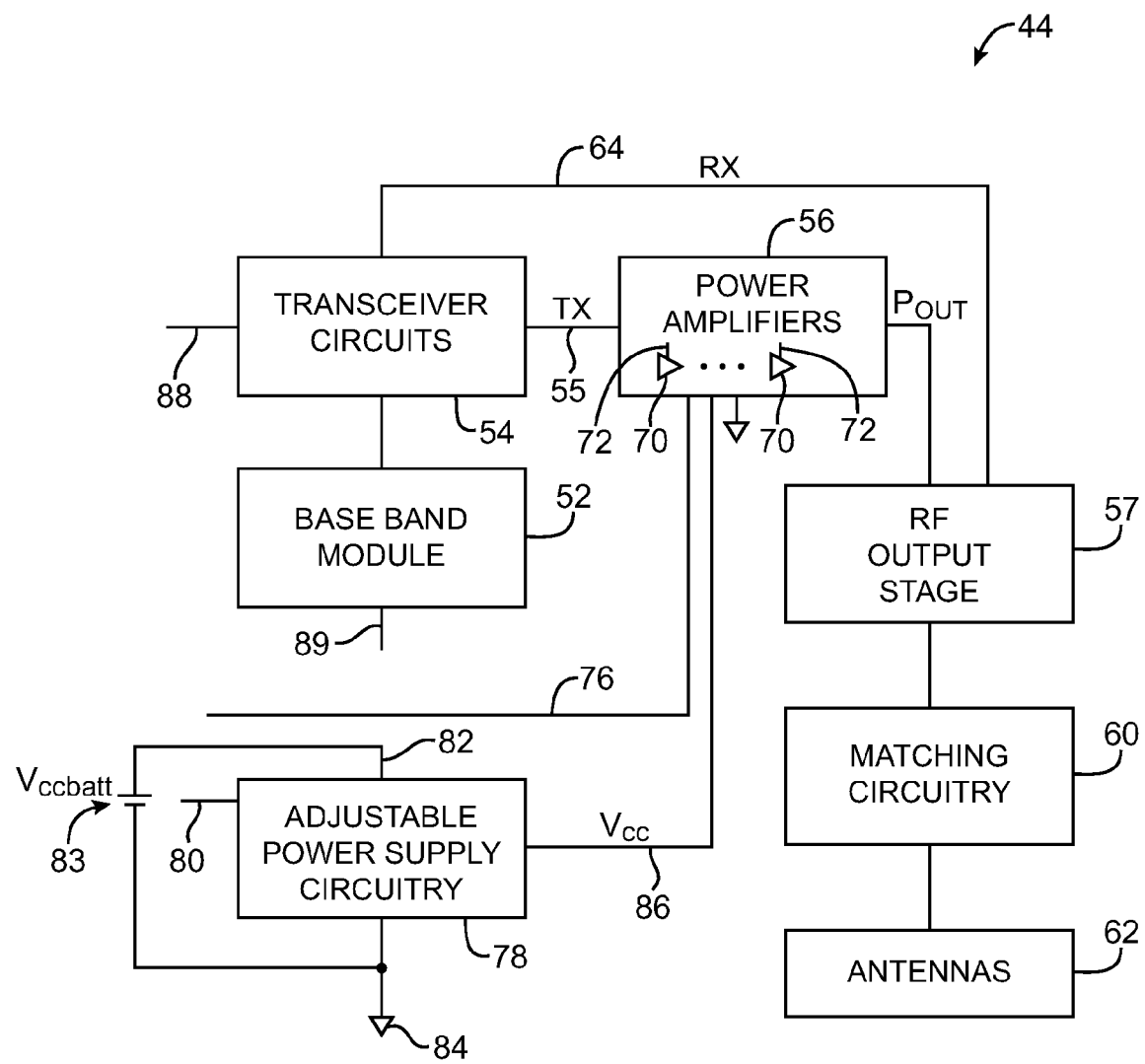
FIG. 2 is a circuit diagram of illustrative wireless communications circuitry that may be used in an electronic device calibrated in accordance with an embodiment of the present invention.

Illustrative wireless communications circuitry that may be used in circuitry 18 of FIG. 1 in device 10 is shown in FIG. 2. As shown in FIG. 2, wireless communications circuitry 44 may include one or more antennas such as antennas 62. Data signals that are to be transmitted by device 10 may be provided to baseband module 52 (e.g., from storage and processing circuitry 12 of FIG. 1). Baseband module 52 may be implemented using a single integrated circuit (e.g., a baseband processor integrated circuit) or using multiple circuits. Baseband processor 52 may receive signals to be transmitted over antenna 62 at input line 89 (e.g., from storage and processing circuitry 12). Baseband processor 52 may provide signals that are to be transmitted to transmitter circuitry within RF transceiver circuitry 54. The transmitter circuitry may be coupled to power amplifier circuitry 56 via path 55. Control path 88 may receive control signals from storage and processing circuitry 12 (FIG. 1). These control signals may be used to control the power of the radio-frequency signals that the transmitter circuitry within transceiver circuitry 54 supplies to the input of power amplifiers 56 via path 55. This transmitted radio-frequency signal power level is sometimes referred to herein as Pin, because it represents the input power to power amplifier circuitry 56.

During data transmission, power amplifier circuitry 56 may boost the output power of transmitted signals to a sufficiently high level to ensure adequate signal transmission. Radio-frequency (RF) output stage circuitry 57 may contain radio-frequency switches and passive elements such as duplexers and diplexers. The switches in RF output stage circuitry 57 may, if desired, be used to switch circuitry 44 between a transmitting mode and a receiving mode. Duplexer and diplexer circuits and other passive components in RF output stage may be used to route input and output signals based on their frequency. A connector in stage 57 may allow an external cable to be connected to device 10 for calibration.

Matching circuitry 60 may include a network of passive components such as resistors, inductors, and capacitors and ensures that antenna structures 62 are impedance matched to the rest of the circuitry 44. Wireless signals that are received by antenna structures 62 may be passed to receiver circuitry in transceiver circuitry 54 over a path such as path 64. A low noise amplifier in the receiver circuitry of transceiver circuits 54 may be used to amplify incoming wireless signals from path 64.

Each power amplifier (e.g., each power amplifier in power amplifiers 56) may include one or more power amplifier stages such as stages 70. As an example, each power amplifier may be used to handle a separate communications band and each such power amplifier may have three series-connected power amplifier stages 70. Stages 70 may have control inputs such as inputs 72 that receive control signals. The control signals may be provided using a control signal path such as path 76. In a typical scenario, storage and processing circuitry 12 (FIG. 1) may provide control signals to stages 70 using a path such as path 76 and paths such as paths 72. The control signals from storage and processing circuitry 12 may be used to selectively enable and disable stages 70.

By enabling and disabling stages 70 selectively, the power amplifier may be placed into different gain modes. For example, the power amplifier may be placed into a high gain mode by enabling all three of power amplifier stages 70 or may be placed into a low gain mode by enabling two of the power amplifier stages. Other configurations may be used if desired. For example, a very low gain mode may be supported by turning on only one of three gain stages or arrangements with more than three gain mode settings may be provided by selectively enabling other combinations of gain stages (e.g., in power amplifiers with three or more than three gains stages).

Adjustable power supply circuitry such as adjustable power supply circuitry 78 may be powered by voltage source 83. Voltage source 83 may be, for example, a battery such as battery 14 of FIG. 1. Source 83 may supply a positive battery voltage to adjustable power supply circuitry 78 at positive power supply terminal 82 and may supply a ground voltage to adjustable power supply circuitry 78 at ground power supply terminal 84. Source 83 may be implemented using a lithium ion battery, a lithium polymer battery, or a battery 14 of any other suitable type.

Initially, the voltage supplied by battery source 83 may be high. As the battery becomes depleted, the voltage supplied by the battery will tend to drop. By using adjustable power supply circuitry 78, the amount of voltage Vcc that is supplied to power amplifier circuitry 56 over power supply voltage path 86 may be maintained at a desired value. For example, power supply circuitry 78 may, under appropriate conditions, receive a raw battery voltage from source 83 that drops with time and may produce a relatively constant output power Vcc on output path 86. This may help to avoid wasteful situations in which the circuitry of power amplifiers 56 is supplied with excessive voltages while the battery of source 83 is fresh. Such excessive voltages may lead to wasteful power consumption by circuitry 56.

Adjustable power supply circuitry 78 may be controlled by control signals received over a path such as path 80. The control signals may be provided to adjustable power supply circuitry 78 from storage and processing circuitry 12 (FIG. 1) or any other suitable control circuitry. The control signals on path 80 may be used to adjust the magnitude of the positive power supply voltage Vcc that is provided to power amplifier circuitry 56 over path 86. These power supply voltage adjustments may be made at the same time as gain mode adjustments are being made to the power amplifier circuitry 56 and at the same time that adjustments are being made to the power (Pin) on path 55. By making power supply voltage adjustments, gain level adjustments to power amplifier circuitry 56, and adjustments to the input power Pin at the input of power amplifier circuitry 56, power consumption by power amplifier circuitry 56 can be minimized and battery life may be extended under a variety of operating conditions.

Consider, as an example, a situation in which device 10 has received a transmit power command from a wireless base station that specifies a desired level of radio-frequency power to be transmitted by device 10. Storage and processing circuitry 12 can determine appropriate settings for wireless circuitry 44 that ensure that the desired power is transmitted through antenna 62, while minimizing power consumption. If, for example, the desired amount of transmitted power is relatively low, power may be conserved by turning off one or more of stages 70 in power amplifier circuitry 56. Power can also be conserved by reducing the power supply voltage Vcc that is supplied on path 86 when the maximum power supply voltage level is not required. Adjustments to Pin on path 55 may be made to ensure that performance requirements are met.

Adjustments such as these may be made by supplying control signals from storage and processing circuitry 12 to transceiver circuits 54 via path 88, power amplifiers 56 via path 76, and to adjustable power supply circuitry 78 via path 80. In particular, control signals may be provided from storage and processing circuitry 12 to power amplifier circuitry 56 on path 76 that adjust the gain level of the power amplifier (e.g., by turning on and off certain gain stages 70 in power amplifier circuitry 56). Additional adjustments to the performance of the power amplifier circuitry 56 may be made by using path 86 to supply a desired adjustable power supply voltage Vcc to power amplifier circuitry 56 from adjustable power supply circuitry 78 in accordance with control signals supplied on path 80. For example, if it is not necessary to operate the active amplifier stages in amplifier circuitry 56 at maximum gain, power can be conserved by lowering the power supply voltage Vcc to the active gain stages. At the same time, the magnitude of Pin on path 55 can be controlled.

During adjustments to transceiver circuitry 54, power amplifier circuitry 56, and power supply circuitry 78, storage and processing circuitry 12 can take steps to satisfy desired operating constraints on power amplifier circuitry 56 such as minimum desired output power settings and minimum values of adjacent channel leakage ratio (the ratio of transmitted power to adjacent channel power).

Wireless communications circuitry 44 of FIG. 2 may include circuitry for supporting any suitable types of wireless communications. For example, circuitry 44 may include circuits for supporting traditional cellular telephone and data communications (sometimes referred to as "2G" communications). An example of 2G cellular telephone systems are those based on the Global System for Mobile Communication (GSM) systems. Circuitry 44 may also include circuits for supporting newer communications formats (sometimes referred to as "3G" communications). These newer formats may support increased communications speeds and may be used for both data and voice traffic. Such formats may use wide band code-division multiple access (CDMA) technology.

Adjustable power supply circuitry 78 may be implemented using a DC/DC converter or any other suitable power conversion circuit. Circuitry 78 may receive a relatively higher voltage Vccbatt from battery 83 over power supply path 82 and may produce a corresponding regulated power supply voltage Vcc at a relatively lower voltage Vcc at output path 86. In a typical arrangement, the battery voltage Vccbatt may range from about 4.3 volts to about 3.4 volts and output voltage Vcc may range from about 3.4 volts to 3.1 volts. The voltage Vcc may be adjusted based on control signals received over path 80. Voltage Vcc may be adjusted continuously (e.g., to provide any desired output voltage in the range of 3.1 to 3.4 volts or other suitable range) or may be set to one of two or more discrete levels (e.g., 3.1 volts, 3.4 volts, etc.).

Power amplifier circuitry 56 may include multiple power amplifiers each of which handles a different communications band (e.g., bands at communications frequencies such as 850 MHz, 900 MHz, 1800 MHz, and 1900 MHz). If desired, some or all of power amplifiers in circuitry 56 may handle multiple communications bands (e.g., adjacent bands).

Power amplifier circuitry 56 may receive control signals over path 76. The control signals may be used to selectively turn on and off particular blocks of circuitry within each power amplifier. This type of adjustment may be used to place each power amplifier 56 in a desired gain mode. In a bimodal arrangement, each power amplifier may be placed in either a high gain mode or a low gain mode. If desired, other types of multimode arrangements may be supported (e.g., arrangements in which power amplifiers 56 can be adjusted to operate at three or more different gain settings.)

Components such as power amplifiers 56 do not always need to run at the maximum available battery voltage Vccbatt. Operating such components at battery voltages such as these can therefore waste power. To minimize the amount of wasted power, DC/DC converter circuitry 78 may be used to convert the unregulated and fluctuating voltage Vccbatt from its sometimes relatively high voltage levels to a more moderate power supply voltage level Vcc. The value of Vcc might be, for example, 3.1 volts or 3.4 volts (as an example). Because Vcc is significantly less than the maximum value of Vccbatt, power amplifiers 56 will not be overpowered and may therefore be powered efficiently.

If desired, the magnitude of power supply voltage Vcc may be adjusted in real time by storage and processing circuitry 12 to help minimize power consumption. A graph showing how an adjustable power supply circuit such as an adjustable dc-to-dc converter with a continuously variable output voltage Vcc may provide a radio-frequency power amplifier with suitable power supply voltages Vcc at various different power amplifier gain settings according to required values of transmitted radio-frequency power Pout is shown in FIG. 3.

Figure 3:
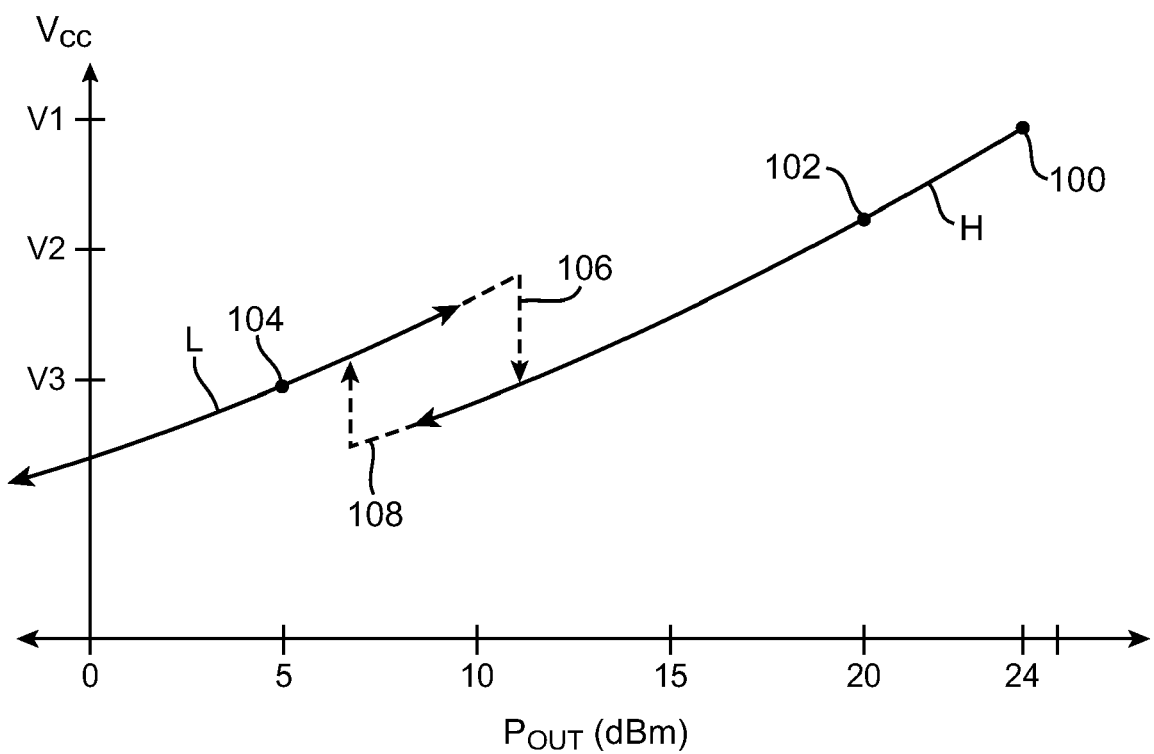
FIG. 3 is a graph showing how an adjustable power supply circuit may provide a radio-frequency power amplifier with different power supply voltages and how different power amplifier gain settings may be used when supplying various amounts of radio-frequency output power in accordance with an embodiment of the present invention.

As shown in FIG. 3, a power amplifier such as one of power amplifiers 56 may be characterized by two gain settings (as an example). In the FIG. 3 example, various gain stages in power amplifier 56 may be selectively enabled so that power amplifier may be set to operate in one of two gain modes. In high gain mode, the power amplifier may be characterized by line "H." In low gain mode, the power amplifier may be characterized by line "L."

The curves of FIG. 3 show how the power supply voltage Vcc for the power amplifier may be reduced to minimize power consumption. The amount of power that may be saved depends, in general, on the amount of output power that is required at the output of power amplifier 56. When required (e.g., in accordance with a wireless network TPC instruction or other requirement), the power amplifier may be operated in its maximum gain mode and at its highest operating voltage Vcc. For example, when an output power of 24 dBm is required (in the FIG. 3 example), the power amplifier may be placed in its high gain mode and may be powered with a power supply voltage of V1 (point 100 on line H). When a lower output power is required, such as 20 dBm, it is no longer necessary to operate the power amplifier at V1. Rather, the power supply voltage for the power amplifier may be reduced to a Vcc value of V2 (point 102 on line H). This helps reduce power consumption. If an output power of 5 dBm is required, power consumption can be reduced further by placing the power amplifier in its low gain mode and reducing the power supply voltage to V3 (point 104).

As the example of FIG. 3 illustrates, both gain mode adjustments and power amplifier power supply voltage adjustments can be used in reducing power consumption for power amplifier 56. If desired, the potential inefficiencies of DC/DC converter 78 under certain operating conditions may be taken into account when making adjustments of this type. The efficiency of DC/DC converter 78 and other power regulator circuitry may be affected by the operating voltage Vcc and operating current Icc that DC/DC converter 78 produces at its output. At high output voltages Vcc and high output currents Icc, adjustable power supply circuitry such as DC/DC converters may operate at peak efficiency. At lower Vcc and Icc levels, efficiency tends to drop. It may therefore be most efficient to reduce power supply voltage Vcc only in situations in which the power amplifier power savings that are obtained by reducing Vcc are not offset by increases in power consumption in DC/DC converter 78. When Vcc is reduced, the values of power supply current and voltage that are used in powering power amplifier 56 tend to fall and overall power consumption will be reduced, so long as the reductions in power amplifier power consumption are not overwhelmed by power losses due to operating power supply circuitry 78 in an inefficient regime.

During operation of device 10, storage and processing circuitry 12 may control the power supply voltage from power supply 78 in accordance with the graph of FIG. 3. Dashed lines 106 and 108 indicate how it may be desirable to incorporate hysteresis into the control algorithm. Hysteresis in the curve of FIG. 3 may help transmitter circuitry in transceiver circuits 54 to satisfy phase discontinuity specifications.

The performance of wireless circuitry 18 in device 10 such as wireless circuitry 44 of FIG. 2 varies as a function of operating frequency. As a result, circuitry 44 will exhibit more "headroom" at some operating frequencies than others. The additional margin that exists at particular operating frequencies represents a potential for additional power savings. The highest levels of amplifier performance typically require correspondingly large power supply voltages. As a result, if there is not much performance margin at a particular operating frequency, it can be difficult or impossible to reduce the power supply voltage for the power amplifier to conserve power. On the other hand, at frequencies at which there is sufficient operating margin, power consumption by the power amplifier circuitry can be minimized by reducing the power supply voltage as described in connection with FIG. 3.

An important performance characteristic in many wireless systems is so-called adjacent channel leakage ratio (ACLR). ACLR values are a measure of how well adjacent channels are isolated from each other. When adjacent channels are well isolated from each other, ACLR values will be low (e.g., less than −33 dBc or even lower). When signals from one channel spill over into an adjacent channel, ACLR will be high (e.g., more than −33 dBc).

Figure 4:
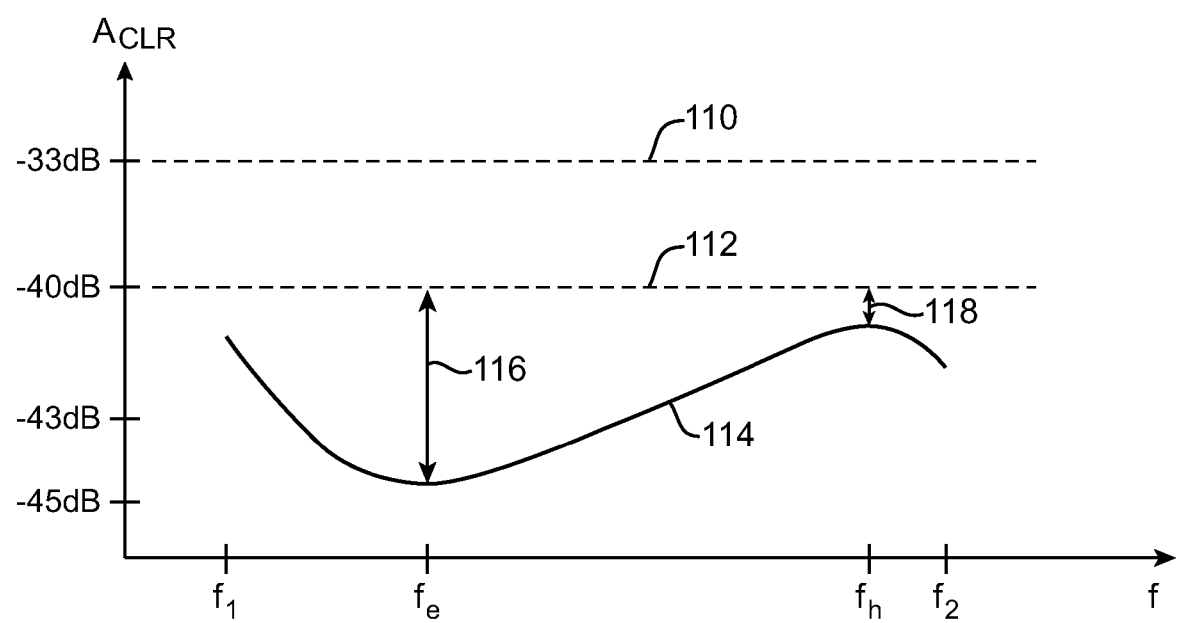
FIG. 4 is a graph showing how adjacent channel leakage ratio characteristics may vary as a function of transmitter frequency in electronic devices using wireless communications circuitry in accordance with an embodiment of the present invention.

A graph showing how ACLR may vary as a function of frequency in a given communications band is shown in FIG. 4. In the example of FIG. 4, device 10 is transmitting signals in a series of communications channels in a communications band that extends from lower frequency f1 to higher frequency f2. This range of frequencies may be associated with any suitable communications band (e.g., the transmission frequencies associated with a 1900 MHz band, as an example). In FIG. 4, ACLR values are plotted as a function of device operating frequency f. Dashed line 110 indicates a typical carrier-imposed ACLR requirement of −33 dBc. When operating wireless devices in the network of a carrier that imposes a −33 dBc ACLR requirement, all portions of ACLR curve 114 must be less than −33 dBc (i.e., curve 114 must lie under dashed line 110 in the graph of FIG. 4). Other carriers may impose more stringent or more lenient specifications. Moreover, a device manufacturer may decide to impose different standards. As an example, a device manufacturer may institute a self-imposed ACLR specification of −40 dBc, as illustrated by dashed line 112. The device manufacturer may impose a more stringent ACLR specification than the carrier to ensure that users of devices such as device 10 will be provided with high quality signals and to allow for manufacturing variations in device 10.

As the example of FIG. 4 demonstrates, some frequencies, such as frequency fe are associated with particularly good adjacent channel leakage ratios, whereas other frequencies, such as frequency fh are associated with relatively poorer adjacent channel leakage ratios. As indicated by lines 116 and 118, there is more operating margin at frequency fe than at frequency fh. Because of the additional overhead available at frequency fe, it is possible to reduce the power supply voltage Vcc for power amplifier circuitry 56 when device 10 is transmitting a radio-frequency signal in the channel at frequency fe. There is less overhead available at frequency fh, so little or no reduction to Vcc at fh may be made. By operating power amplifier circuitry 56 at a relatively high value of Vcc at frequency fh, the linearity of power amplifier circuitry 56 may be maximized, thereby helping device 10 produce its best possible ACLR value at fh. The reduced value of Vcc that is used at frequency fe may somewhat reduce the linearity of power supply circuitry 56 at frequency fe, causing power supply circuitry 56 to exhibit more adjacent channel leakage. This, in turn, will cause the ACLR value at frequency fe to increase, using up the operating margin 116. Using margin 116 in this way allows the Vcc value at frequency fe to be reduced, thereby conserving power.

If desired, the output power from transceiver circuitry 54 (Pin) may be adjusted to compensate for frequency-dependent fluctuations in output power. Storage and processing circuitry 12 may make these adjustments by supplying control signals to control path 88 (FIG. 2).

Figure 5:
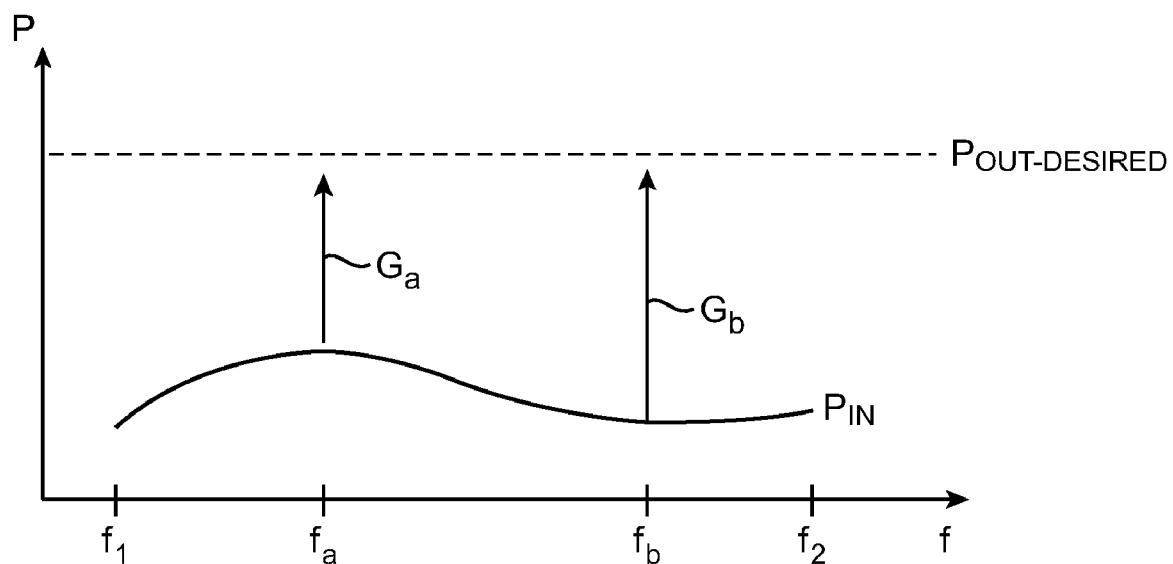
FIG. 5 is a graph showing how the amount of input power that is required to produce a desired output power with a radio-frequency transmitter power amplifier in an electronic device may vary as a function of frequency in accordance with an embodiment of the present invention.

A graph showing how Pin may be adjusted as a function of frequency to ensure that a particular constant output power Pout-desired is produced at the output of power amplifiers 56 (and antennas 62) is shown in FIG. 5. As the graph of FIG. 5 demonstrates, a given communications band (ranging from frequency f1 to frequency f2) may have some frequencies such as frequency fa in which power amplifier circuitry 56 is characterized by a relatively low gain Ga, so that a relatively large Pin value is needed at the output of transceiver circuits 54. At other frequencies in the same band, such as frequency fb, power amplifier circuitry 56 is characterized by a relatively higher gain Gb, so that a relatively small Pin value can be supplied at the output of transceiver circuits 54. In both situations, the combination of Pin and amplifier gain result in the same output power level (Pout-desired).

Figure 6:
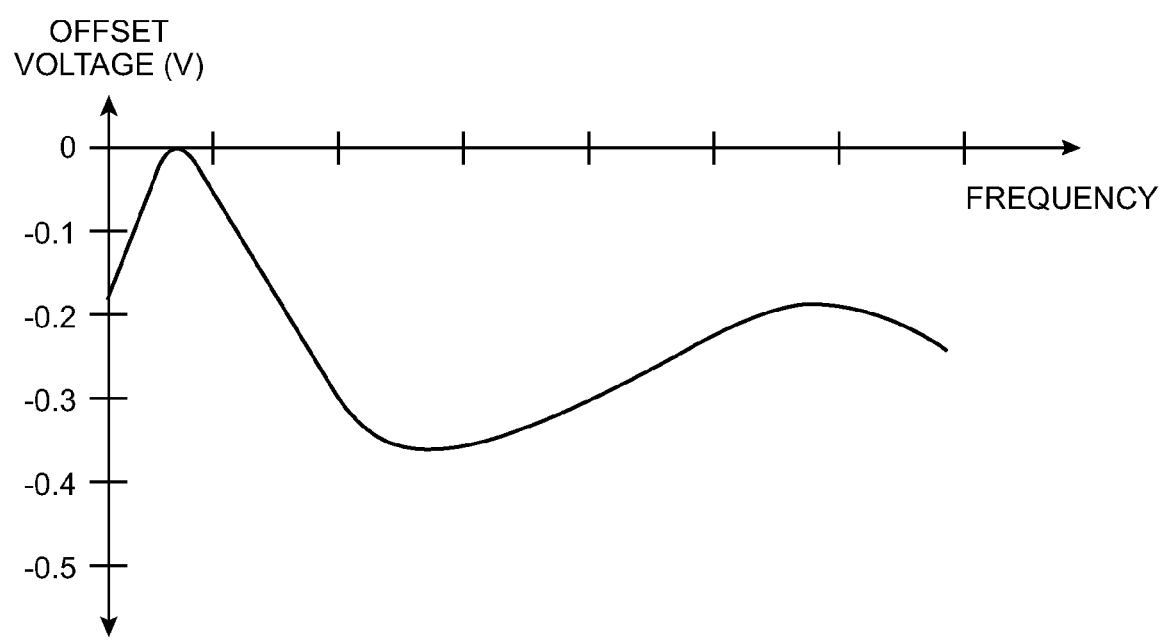
FIG. 6 is a graph of an illustrative radio-frequency power amplifier power supply voltage offset curve that may be used in operating an electronic device in accordance with an embodiment of the present invention.

The reductions in operating voltage Vcc that can be made selectively as a function of frequency to take advantage of excess ACLR overhead may be stored in a given device 10 in the form of frequency-dependent power supply voltage offset data. A typical power supply voltage offset curve is shown in FIG. 6. As shown in the FIG. 6 example, there may be particular frequencies at which it is possible to reduce the power supply voltage Vcc considerably and there may be particular frequencies at which little or no reduction to Vcc for power amplifier circuitry 56 is possible while still meeting required performance criteria such as required ACLR values. Because the magnitude of the Vcc reductions that are possible while meeting ACLR specifications depend upon frequency, the Vcc reductions form an offset curve or table. This offset data is a type of calibration data and may be stored in memory in device 10 (e.g., storage and processing circuitry 12), so that device 10 can make appropriate Vcc adjustments during normal operation.

Characterizing measurements may be made to device 10 in any suitable environment. For example, characterizing measurements are made during laboratory testing. Laboratory characterization techniques may be particularly useful in identifying aspects of device performance that are to be calibrated in the same way for all devices 10 that are manufactured.

Characterising measurements may also be made on a device-by-device basis. This allows more accurate results to be obtained than when characterization measurements are made on a more global level. With an individualized calibration scheme, each device that is manufactured is calibrated and corresponding calibration results are stored in that device. When a given device operates, the individual calibration results for the device that have been stored in the device may be retrieved by the device and used to calibrate the device.

Although individualized calibration techniques can offer more accurate calibration results than nonindividualized calibration techniques, care should be taken so that test times do not increase excessively. If desired, an open loop characterization measurement scheme may be used to perform individual device calibration. For example, test equipment such as a spectrum analyzer may be used that measures the transmitted radio-frequency power in each channel and its adjacent channels, while a device under test is directed to systematically step through all transmitting channels of interest. During these characterizing measurements, a variety of amplifier input powers Pin and power supply voltages Vcc may be used to determine optimum settings that satisfy operating constraints such as maximum permitted ACLR values, desired output power level, etc.

To reduce test complexity and cost, it may be desirable to perform calibration operations using test equipment such as a power meter. Test equipment based on power meters may be less complex than other test equipment.

Although the use of power meters to make certain calibrating measurements may be cost effective and may provide a high test throughput, is not possible to use conventional power meter arrangements to make measurements such as ACLR measurements.

Figure 7:
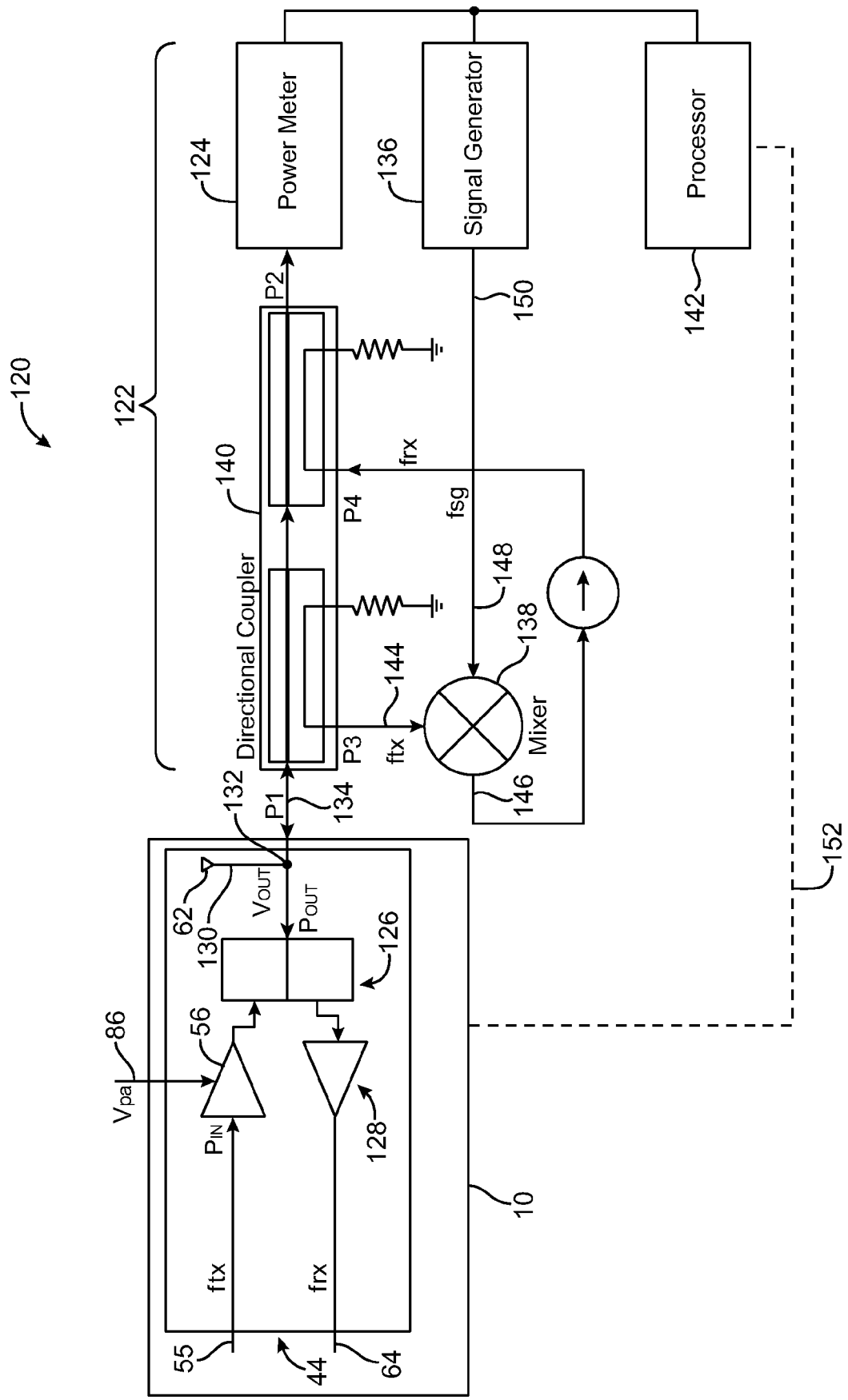
FIG. 7 is a diagram of illustrative characterizing equipment that may be used in measuring radio-frequency performance for electronic devices in accordance with embodiments of the present invention.

This may be addressed using test equipment of the type shown in FIG. 7. As shown in FIG. 7, electronic device 10 may be characterized using systems such as system 120 that contain test equipment 122. Equipment 122 may be based on a power meter such as power meter 124. Power meter 124 may be used to make power measurements on radio-frequency signals that are transmitted from wireless circuitry 44 of device 10. For example, power meter 124 may be used to monitor the transmitted output power from device 10 as a transceiver in device 10 is being adjusted to supply various input powers to power amplifier circuitry.

As shown in FIG. 7, wireless circuit 44 may have an input such as input 55 that receives radio-frequency signals from transceiver circuits 54 (FIG. 2). Power amplifier circuitry 56 may receive a controllable power supply voltage Vpa (i.e., Vcc of FIG. 2) on input line 86. Outgoing radio-frequency signals may be amplified by amplifier circuitry 56 and transmitted via antenna 62. A radio-frequency connector 132 may be used in path 130 to selectively connect test equipment 122 to device under test 10.

During normal operation, cable 134 in equipment 122 is detached from connector 132 and radio-frequency signals propagate from the output of amplifier 56 to antenna 62 for wireless transmission to a remote radio-frequency receiver. During testing, cable 134 is attached to connector 132. This breaks the electrical connection between the output of amplifier 56 and antenna 62 and routes outgoing radio-frequency signals from the output of power amplifier 56 to cable 134.

A duplexer such as duplexer 126 may be inserted in the input-output path as shown in FIG. 7. The duplexer may route radio-frequency signals based on their frequency. Each radio-frequency communications band may have a subband of transmit channels and a non-overlapping subband of receive channels. The subband of transmit channels may, for example, lie about 190 MHz below the subband of receive channels (as an example). When transmitted radio-frequency signals in the transmit subband are received by duplexer 126 from the output of power amplifier 56, duplexer 126 can route these transmitted radio-frequency signals to cable 134 (during testing) or antenna 62 (during normal operation). Incoming radio-frequency signals in the receive band may be received from antenna 62 (during normal operation) or cable 134 (during testing) and may be routed to the input of low noise amplifier 128 by duplexer 126.

With the arrangement of FIG. 7, ACLR measurements can be made using the receiver circuitry (transceiver circuits 54 of FIG. 2) in device 10, rather than costly external equipment. During calibration measurements, transmitted radio-frequency signals may be upconverted from the transmit subband to the receive subband and returned to the input of device 10 via cable 134 and connector 132.

Upconversion (i.e., frequency shifting) may be performed using a signal generator such as signal generator 136 and a mixer such as mixer 138. Processor 142 may be used to control device 10 and equipment 122 during calibration operations. Following calibration, processor 142 may supply device 10 with calibration data via path 152. Processor 142 may be based on any suitable processing circuitry such as one or more computers, etc. Path 152 may be any suitable communications path such as a serial or parallel digital path (wired or wireless).

Directional coupler 140 may be used to route signals. Outgoing signals (i.e., transmitted signals from the output of power amplifier 56) may be routed from port P1 to port P3. A fraction of the power that is provided to port P1 of directional coupler 140 may be routed to port P3. For example, 1% of the transmitted power that reaches port P1 may be supplied as an output signal via port P3. The remaining fraction (e.g., 99% of the power at P1) may be routed to power meter 124 via port P2 of directional coupler 140 for measurement by power meter 124.

The signal supplied at port P3 is applied to input port 144 of mixer 138. Signal generator 136 may produce a radio-frequency signal at frequency fsg at output 150. The frequency fsg may initially be selected to be equal to the intraband spacing between the transmit subband and the receive subband. Consider, for example, the communications band at frequencies between 1920 and 2170 MHz (sometimes referred to as the 2100 MHz band or the 2170 MHz band). The transmit subband for this communications band includes 60 5 MHz channels in the frequency range of 1920 MHz to 1980 MHz, whereas the receive subband includes 60 corresponding 5 MHz channels extending from 2110 MHz to 2170 MHz. The distance between respective transmit and receive channels is 190 MHz (i.e., 2110 MHz–1920 MHz). In this situation, the frequency fsg of the signal supplied at output 150 of signal generator 136 may be 190 MHz.

The signal generator output at frequency fsg serves as a frequency conversion (frequency shifting) signal (e.g., for upconversion) and may be applied to input 148 of mixer 138, as shown in FIG. 7. Mixer 138 may receive the transmitted signal at frequency ftx on input 144 and may receive the signal generator output at frequency fsg on input 148. A resulting mixed radio-frequency output may be supplied at output 146 of mixer 138.

The output of radio-frequency mixer 138 at output 146 is frequency shifted (e.g., upconverted) by an amount equal to the conversion frequency fsg supplied by signal generator 136. As an example, consider the situation in which the transceiver circuitry in device 10 has been adjusted to transmit radio-frequency signals in the second channel in the 1920-1980 MHz transmit subband. In this situation, the frequency ftx of the transmitted radio-frequency signals that pass from device 10 to port P1 of directional coupler 140 over path 134 will be equal to 1925 MHz. If processor 142 directs signal generator 150 to produce a frequency fsg on line 150 of 190 MHz (as an example), the radio-frequency output signal on output 146 of mixer 148 will contain an upconverted portion frx at 2115 MHz (i.e., at 1925 MHz+190 MHz), corresponding to the second channel in the receive subband.

The output signal from output 146 of mixer 138 may be routed to port P4 of directional coupler 140. A fraction (e.g., 0.1%) of the radio-frequency signal power that is applied to port P4 of directional coupler 140 is routed to port P1 as an output signal. Accordingly, a known fraction of the frequency-shifted output signal from mixer 138 is routed to the input of device 10 via directional coupler 140 and path 134. In device 10, this signal is routed to the input of low noise amplifier 128 via duplexer 126. Line 64 may be used to convey this signal to radio-frequency receiver circuitry in transceiver circuits 54. The transceiver circuits 54 may measure the power of the received signal. Calibration measurement data may then be passed from device 10 to processor 142 using path 152.

During calibration measurement, operating parameters in device 56 such as the settings of power amplifier 56 (e.g., the gain setting and the power supply voltage Vpa), the settings of transceiver circuits 54 (e.g., the power Pin that is supplied to power amplifier 56 on path 55), and the transmit channel and receive channel frequencies of transceiver circuits 54 may be adjusted. The output frequency fsg of signal generator may also be adjusted. Control signals may be provided to device 10 and signal generator 136 by processor 142 during calibration operations to make these adjustments.

When it is desired to make ACLR measurements, the frequency fsg may be adjusted (e.g., by +/−5 MHz) to shift signal frx up and/or down by one channel with respect to the current center channel. This allows the receiver in device 10 to measure adjacent channel powers (e.g., adjacent channel powers for channels one and three when the currently transmitted signal is associated with channel two). If desired, the receiver in device 10 can be tuned to select which received channel is being measured. A combination of signal generator output frequency adjustments and internal receiver tuning adjustments in transceiver circuit 54 of device 10 may also be used to control which signal is being measured. Measurements by power meter 124 may be used to help calibrate the transmitted power (e.g., by measuring the fraction of transmitted power at port P2).

As the receiver circuitry in device 10 makes transmit power measurements (by making measurements on the upconverted transmitted radio-frequency signals), processor 142 (or internal control circuitry in device 10) can adjust the power supply voltage Vpa for power amplifier 56 in real time. If the measured ACLR at a particular frequency is better than required (i.e., ACLR specifications have been exceeded for that channel), the power supply voltage Vpa may be lowered somewhat. This helps reduce power consumption, but tends to make the performance of power amplifier 56 less linear and increases ACLR. If measured ACLR performance is poor for a particular channel, the value of Vpa may be raised until ACLR criteria are satisfied. This type of calibration scheme may therefore be used to identify optimum Vpa levels for all channels (frequencies) of interest. After the optimum Vpa levels and other suitable calibration settings have been identified, device 10 can be calibrated by loading the calibration data into device 10 (e.g., into nonvolatile memory). During subsequent operations, device 10 may use the calibration data to ensure that ACLR requirements are satisfied while minimizing power consumption by using the lowest possible power supply voltages for radio-frequency power amplifier 56.

Figure 8:
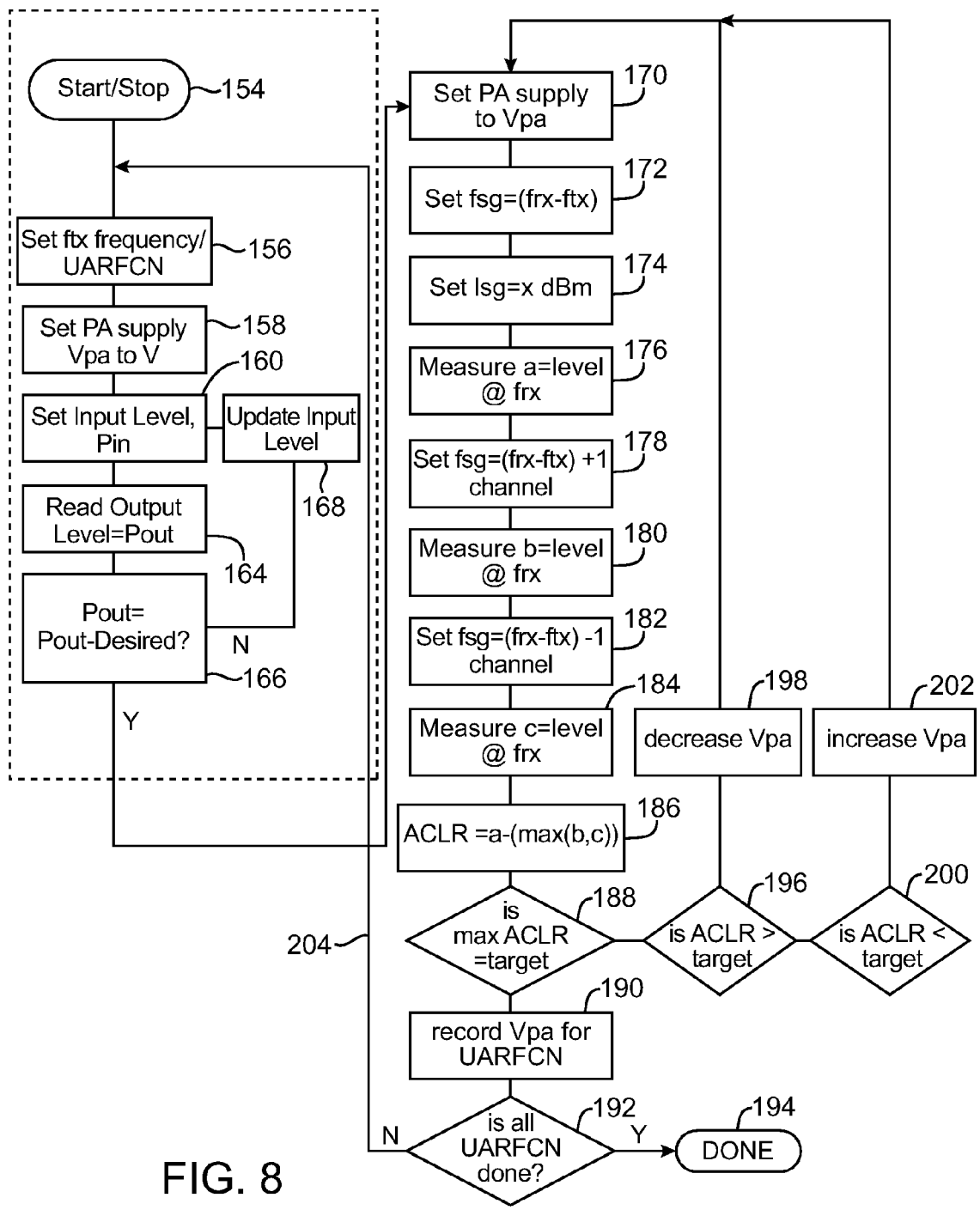
FIG. 8 is a flow chart of illustrative steps involved in obtaining calibration data for wireless communications circuitry in an electronic device in accordance with an embodiment of the present invention.

Illustrative steps involved in performing calibration operations using a test system such as test system 120 of FIG. 7 are shown in FIG. 8.

At step 154, the calibration process begins. A device under test (e.g., a device 10 in a factory or other manufacturing environment) is connected to test equipment 122. During testing, test operations may be controlled using software running in storage and processing circuitry 12 of device 10 and/or software running on external hardware such as processor 142 in test equipment 120.

At step 156, transceiver circuits 54 are set to a desired transmit frequency, i.e., a desired uplink channel (UARFCN) in a transmit subband.

At step 158, adjustable power supply circuitry 78 may be used to supply a power supply voltage Vpa to power amplifiers 56 (e.g., at a default value V). At step 160, transceiver circuits 54 may be adjusted to supply radio-frequency signals at a given input power Pin at the desired transmit frequency to power amplifiers 56.

Power amplifiers 56 amplify the power Pin to produce a power Pout. This radio-frequency signal is provided to power meter 124 via duplexer 126, path 134, and directional coupler 140 so that that the total transmitted power may be measured. The radio-frequency output signal at Pout is also routed back to the receiver in the device under test. In particular, the transmitted radio-frequency signal is supplied to port P1 of directional coupler 120 and is provided to mixer 138 via port P3. The transmitted signal is then mixed with the signal generator output using mixer 138 to produce a frequency-converted (frequency-shifted) version of the transmitted signal. This frequency-converted version of the transmitted signal is received at port P4 of coupler 140 and is fed back to the device under test using directional coupler 140, duplexer 126, and low noise amplifier 128.

At step 164, the output power Pout of the transmitted channel may be measured using the receiver in the device under test. Measurement results may be provided to processor 142 via path 152 (as an example).

At step 166, it may be determined whether or not the measured output power Pout is equal to a predetermined desired output power Pout-desired (e.g., 24 dBm).

If the desired output level has not been reached, a higher input power Pin may be selected at step 168 and the input power Pin can be adjusted accordingly at step 160.

Once Pout matches the desired output value Pout-desired, the value of Pin can be retained for use in calibrating device 10 and processing can continue at step 170. At step 170, a power supply voltage Vpa for power amplifier 56 may be produced at the output of adjustable power supply circuitry 78.

The shifting frequency fsg for the output signal from signal generator 136 may be selected at step 172 (e.g., an intraband spacing frequency of 190 MHz as an example).

At step 174, the power level lsg for the signal generator output may be selected. The power level lsg may, be set to an appropriate value based on the known properties of directional coupler 140, mixer 138, path 134, connector 132, etc. For example, during a setup process, properties such as coupling efficiency and transmission efficiency may be measured for the radio-frequency components in system 120. Directional coupler 140 and other components may be characterized by transmitting known signal powers into one port while measuring resulting signal powers at other ports. Based on measurements such as these, an appropriate power level lsg for the mixing signal at frequency fsg on signal generator output 150 can be determined. This power level will not overwhelm the signal power at frequency ftx on input 144 of mixer 144 and will providing satisfactory frequency conversion results for the frequency-converted output signal at frequency frx at output 146.

After establishing an appropriate output frequency and power level for signal generator 136, the receiver circuitry in transceiver circuits 54 may be used to measure the received radio-frequency signal power at frequency frx. This measurement may be made on line 64 at the output of low noise amplifier 128. Because the transmitted signal Pout at frequency ftx has been converted in frequency to frequency frx in the receive subband, the radio-frequency signal that is received by duplexer 126 from path 134 is routed to the receiver by duplexer 126 and is proportional to the transmitted power Pout.

Using this type of frequency conversion and feedback approach, the receiver in device under test 10 may make calibrating measurements for the transmitter in device under test 10. Adjacent channel leakage ratio (ACLR) measurements may be made using the receiver in device under test 10 by tuning the receiver and/or signal generator 150 during power measurements.

With one suitable arrangement, adjacent channel power measurements may be made by tuning the receiver up and down by one channel to make a center channel power measurement and upper and lower adjacent channel power measurements. The baseband module or other circuitry in transceiver circuits 54 can compute received powers using known automatic gain control setting information for transceiver circuits 54.

With the approach illustrated in the example of FIG. 8, adjacent channel power measurements are made by adjusting the signal generator output, while the receiver's channel setting is held fixed (i.e., by tuning signal generator 136 to select between the current channel under test, the next highest channel, and the next lowest channel rather than using transceiver circuits 54 to tune between these channels).

At step 176, the receiver circuitry in transceiver circuits 54 measures the received radio-frequency signal power at frequency frx on line 64 at the output of low noise amplifier 128. Because the transmitted signal Pout at frequency ftx has been converted in frequency to frequency frx, the radio-frequency signal that is received by duplexer 126 from path 134 is routed to the receiver and is proportional to the transmitted power Pout. During step 176, this measured power corresponds to the current channel being tested (i.e., the nominal transmit channel frequency being calibrated such as channel two, not the adjacent channel above or below the current transmit channel such as channels one and three in this example).

At step 178, the frequency fsg on output 150 of signal generator 136 is adjusted to correspond to a one-channel-up frequency shift. In particular, the frequency of fsg is adjusted upwards by one channel width (e.g., by an additional 5 MHz if the channel spacing in the band being calibrated is 5 MHz). When the frequency fsg is raised by one channel spacing (e.g., to 195 MHz), the frequency-converted output at output 146 of mixer 138 will be shifted by one channel. This will cause the channel that was previously one channel below ftx (e.g., channel one) to be routed to the receiver in place of the channel under test (i.e., in place of channel two in this example). The power of this adjacent channel (i.e., the next lower channel) may be measured by the receiver in device under test 10 during step 180.

At step 182, the frequency fsg may be set to correspond to a one-channel-down frequency shift (i.e., to 185 MHz, which is 5 MHz below the original fsg frequency of step 172 in the situation in which the channel spacing is 5 MHz). This fsg selection will cause the frequency ftx at mixer input 144 to be shifted lower by one channel (i.e., frequency frx will be lowered by one channel). As a result, the channel that was previously one channel above ftx (e.g., channel three) will be routed to the receiver in device under test 10. The receiver can measure the power of this adjacent channel (i.e., the next higher channel) during step 184.

At the completion of step 184, power measurements have been made for the current channel (i.e., the channel selected at step 156 such as channel two) and channels adjacent to the current channel (i.e., the channels immediately above and below the current channel such as channels one and three). The adjacent channel leakage ratio (ACLR) for the current channel can therefore be calculated from the measured center channel and adjacent channel powers at step 186. ACLR calculations may be made in processor 142 (as an example).

The ACLR level for the current channel may be compared to desired levels at step 188. For example, processor 142 can determine whether the ACLR level that is computed at step 186 matches a carrier-imposed or manufacturer-imposed ACLR requirement for the current communications band.

If the measured ACLR level for device under test 10 is too large (step 196), power supply voltage Vpa for power amplifier 56 may be decreased at step 198 (e.g., by adjusting the output of adjustable power supply circuitry 78 using control signals applied to input 80). Processing can then loop back to step 170.

If the measured ACLR level for device under test 10 is smaller than its desired target value (step 200), power supply voltage Vpa for power amplifier 56 may be increased at step 202, before looping back to step 170 to make further ACLR measurements.

This arrangement ensures that the lowest possible Vpa level that satisfies the desired ACLR criteria can be identified. During step 190, the identified Vpa value for the current transmit channel may be recorded (e.g., in storage associated with processor 142 of FIG. 7).

At step 192, it is determined whether additional transmit channels are to be calibrated. If additional channels are to be calibrated, processing may loop back to step 156, as indicated by line 204. When all desired channels have been covered, processing is complete (step 194). Voltage settings (Vpa) may be gathered for all transmit channels in the transmit subbands of interest. This collection of Vpa versus channel data forms a customized voltage offset table of the type described in connection with FIG. 6. The entries in the table are unique to the particular device that was calibrated and therefore form a type of individualized calibration data. Following the power measurement of FIG. 8, the power amplifier voltage offset table can be loaded into the device that was characterized to calibrate the device. Additional calibration data such as appropriate Pin values versus frequency can also be loaded into the device. When operated in the field, the loaded calibration data can be used to ensure that the device satisfies operating constraints such as ACLR constraints while using minimum amounts of power supply voltage for the radio-frequency power amplifier to conserve power.

Figure 9:
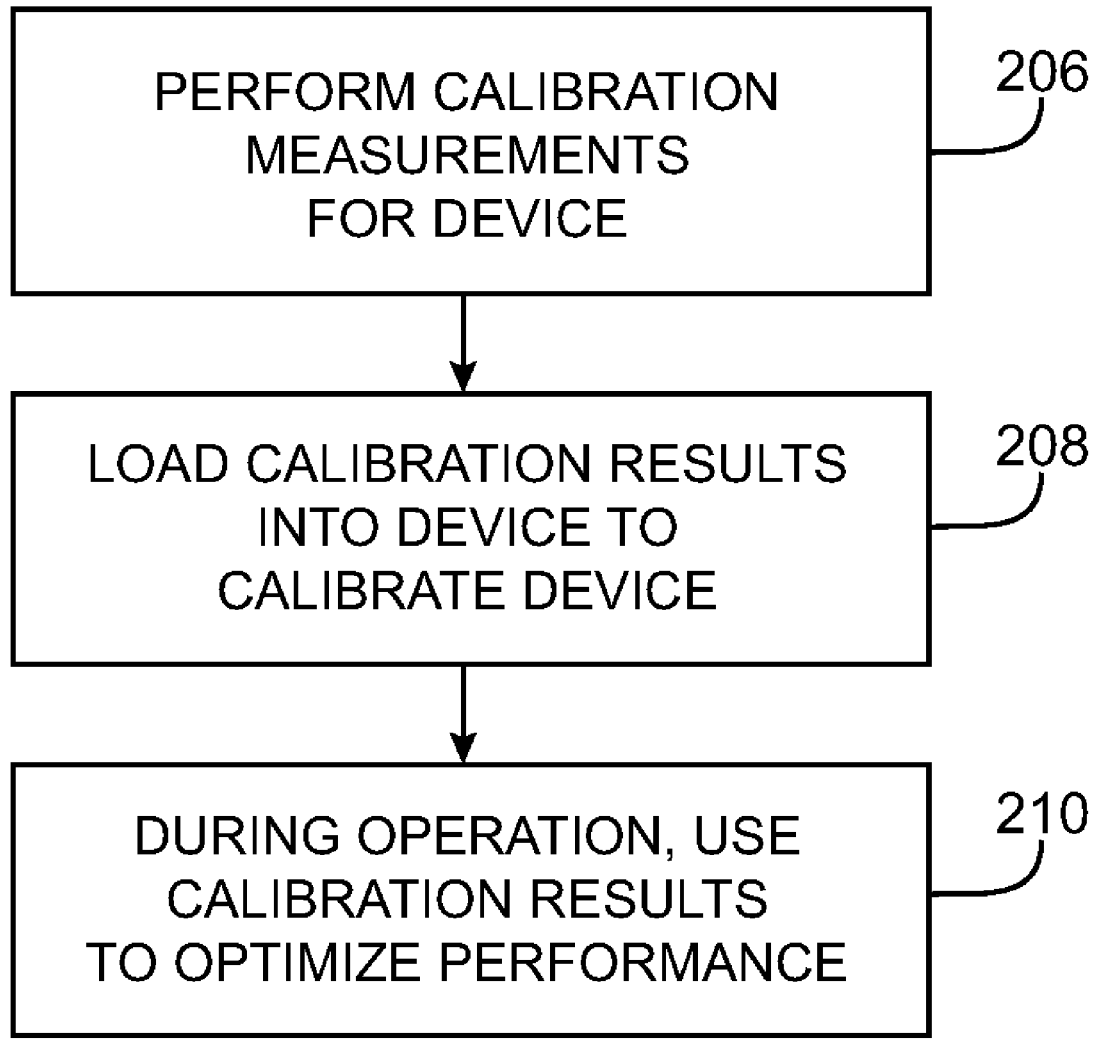
FIG. 9 is a flow chart of illustrative steps involved in calibrating and using an electronic device with power management capabilities in accordance with an embodiment of the present invention.

Illustrative steps involved in calibrating and using electronic devices such as device 10 are shown in FIG. 9.

At step 206, techniques of the type described in connection with FIGS. 7 and 8 may be used to calibrate a device under test. These operations may, for example, be performed by a manufacturer as part of a device manufacturing process. During the calibration measurements, the radio-frequency transmitter in the device under test transmits radio-frequency signals using various input powers Pin and power amplifier power supply voltages Vpa (i.e., Vcc of FIG. 2). Duplexer 126 routes these signals to path 134 in test equipment 122. Directional coupler 140, mixer 138, and signal generator 150 are used to feed back a frequency-shifted (frequency-converted) version of the transmitted signal to duplexer 126. Adjustments to the signal generator output may be used so that measurements can be made on the power of the transmitted channel and so that measurements can be made on the power of adjacent channels.

The frequency-shifted radio-frequency signals are received by duplexer 126. The frequency shifting process changes the frequency of the transmitted signals so that they no longer fall within their original transmit subband. Rather, the frequency-shifted signals fall within the receive subband of device 10. As a result, the frequency-shifted version of the transmitted signals that is fed back to duplexer 126 is routed to the receiver in device 10. The receiver can measure the power associated with the fed back frequency-shifted version of the transmitted power. Measurement results of this type can be obtained for a variety of power amplifier gain settings, power amplifier input powers Pin, power amplifier power supply voltages Vpa, channel frequencies, etc. A database of measurement results can be maintained in test equipment 122. The test equipment can process the measurement results to produce frequency-dependent calibration settings such as settings for input power Pin and power amplifier power supply voltage Vpa that allow the device to satisfy ACLR requirements (maximum permitted ACLR), minimum output power requirements (Pout-desired), and other operating requirements while allowing the amount of power that is consumed to be minimized.

At step 208, the calibration data that has been produced at step 206 may be loaded into device 10. Path 152 may be used to convey measurement data to test equipment 122 during testing and may be used to convey calibration data to device 10. Device 10 may include storage such as non-volatile random-access memory in which calibration settings may be stored. Once device 10 has been calibrated by loading device 10 with calibration data, device 10 can be used by a user (step 210). During use, device 10 adjusts its operating parameters (e.g., Pin, Vpa, power amplifier gain, etc.) according to the calibration settings. The calibration settings therefore ensure that device 10 will satisfy desired performance criteria such as minimum output power levels and maximum (target) ACLR levels without consuming more power than necessary.

The foregoing is merely illustrative of the principles of this invention and various modifications can be made by those skilled in the art without departing from the scope and spirit of the invention.

What is claimed is:

1. A method for using test equipment to calibrate a portable electronic device that contains wireless circuitry, comprising:
    transmitting radio-frequency signals from transceiver circuitry in the electronic device to the test equipment, wherein the test equipment is separate from the portable electronic device; and
    with the transceiver circuitry in the electronic device, measuring a power level associated with a fed-back version of the transmitted radio-frequency signals received from the test equipment.

2. The method defined in claim 1 wherein the electronic device comprises a duplexer and wherein transmitting the radio-frequency signals comprises transmitting the radio-frequency signals from the transceiver circuitry through the duplexer and wherein measuring the power level comprises receiving the fed-back version of the transmitted radio-frequency signals through the duplexer.

3. The method defined in claim 1 wherein the wireless circuitry handles signals associated with a communications band that includes a transmit subband and a receive subband, wherein transmitting the radio-frequency signals comprises transmitting a given signal in the transmit subband, and wherein measuring the power level comprises measuring a power level associated with a fed-back version of the given signal that has been frequency shifted to fall in the receive subband.

4. The method defined in claim 1 wherein the test equipment includes frequency shifting equipment that shifts the transmitted radio-frequency signals in frequency to produce frequency-shifted transmitted radio-frequency signals, and wherein measuring the power level comprises measuring the power level of a fed-back version of the frequency-shifted transmitted radio-frequency signals.

5. The method defined in claim 1 wherein the wireless circuitry includes an adjustable power supply that produces a power supply voltage, wherein the wireless circuitry includes a power amplifier that produces the transmitted radio-frequency signals, and wherein transmitting the radio-frequency signals comprises transmitting the radio-frequency signals while adjusting the power supply voltage with the adjustable power supply to identify minimum acceptable power supply voltage levels while meeting performance criteria for the wireless circuitry.

6. The method defined in claim 5 wherein the test equipment includes frequency shifting equipment that shifts the frequency of the transmitted radio-frequency signals to produce frequency-shifted transmitted radio-frequency signals, and wherein measuring the power level comprises measuring the power level of a fed-back version of the frequency-shifted transmitted radio-frequency signals.

7. A method for calibrating a wireless electronic device having at least one antenna, transceiver circuitry, a radio-frequency power amplifier, and an adjustable power supply that supplies the radio-frequency power amplifier with an adjustable power supply voltage, comprising:
    with the radio-frequency power amplifier, amplifying radio-frequency signals from the transceiver circuitry at a given frequency to be transmitted through the antenna;
    with the adjustable power supply, providing an adjustable power supply voltage to the radio-frequency power amplifier that varies as a function of the given frequency; and
    with the transceiver circuitry, making a power measurement on a fed-back version of the amplified radio-frequency signals that is received from test equipment.

8. The method defined in claim 7 wherein the test equipment includes a directional coupler that receives the amplified radio-frequency signals from the power amplifier and wherein making the power measurement comprises:
    with the transceiver circuitry, making a power measurement on the fed-back version of the amplified radio-frequency signals by measuring the amplified radio-frequency signals after the amplified radio-frequency signals have passed through the directional coupler.

9. The method defined in claim 8 wherein the test equipment includes a signal generator that supplies a signal generator output signal and a mixer that receives the amplified radio-frequency signals from the directional coupler at a first input, that receives the signal generator output signal at a second input, and that produces a frequency-shifted version of the amplified radio-frequency signals at an output, the method further comprising:
    providing the frequency-shifted version of the amplified radio-frequency signals from the output to the directional coupler.

10. The method defined in claim 9 further comprising:
    feeding back the frequency-shifted version of the amplified radio-frequency signals to the wireless electronic device with the directional coupler to form the fed-back version of the amplified radio-frequency signals.

11. The method defined in claim 7 further comprising:
    storing calibration data in the wireless electronic device that is based on the power measurements made with the transceiver circuitry.

12. The method defined in claim 11 further comprising:
    while operating the wireless electronic device, controlling the transceiver circuitry and the power amplifier based on the stored calibration data to ensure that performance criteria for the wireless electronic device are satisfied while minimizing power consumption.

13. The method defined in claim 12 wherein controlling the transceiver circuitry and the power amplifier comprises:
    minimizing the adjustable power supply voltage supplied to the radio-frequency power amplifier based on the stored calibration data while satisfying adjacent channel leakage ratio requirements.

14. The method defined in claim 7 further comprising:
    shifting the amplified radio-frequency signals to multiple different receiver channels using the test equipment.

15. The method defined in claim 7 further comprising:
    computing adjacent channel leakage ratio values based on the power measurements made by the transceiver circuitry.

16. The method defined in claim 7 wherein the fed-back version of the amplified radio-frequency signals has an associated frequency in a cellular telephone receive subband, the method further comprising:
    using a mixer and a signal generator in the test equipment to adjust the associated frequency while the transceiver circuitry is making the power measurement on the fed-back version of the amplified radio-frequency signals.

17. A portable electronic device, comprising:

an antenna;

radio-frequency transceiver circuitry coupled to the antenna;

a radio-frequency power amplifier that amplifies radio-frequency signals from the radio-frequency transceiver circuitry;

adjustable power supply circuitry that supplies an adjustable power supply voltage to the radio-frequency power amplifier; and storage and processing circuitry that adjusts the adjustable power supply voltage supplied by the adjustable power supply circuitry to the radio-frequency power amplifier based on calibration data, wherein the calibration data is based on calibration measurements made using receiver circuitry in the radio-frequency transceiver circuitry.

18. The portable electronic device defined in claim 17 further comprising a connector, wherein the amplified radio-frequency signals are output from the radio-frequency power amplifier, wherein the amplified radio-frequency signals are supplied to test equipment through the connector, and wherein a frequency-shifted version of the amplified radio-frequency signals is fed back to the transceiver circuitry through the connector.

19. The portable electronic device defined in claim 18 wherein the receiver circuitry is configured to make power measurements for computing adjacent channel leakage ratio values using the frequency-shifted version of the amplified radio-frequency signal.

20. The portable electronic device defined in claim 17 wherein the storage and processing circuitry is configured to store power supply voltage offset versus frequency data as part of the calibration data and wherein the storage and processing circuitry uses the stored power supply voltage offset data in adjusting the adjustable power supply voltage.

* * * * *